(12) United States Patent
Kota et al.

(10) Patent No.: US 11,152,038 B2
(45) Date of Patent: Oct. 19, 2021

(54) TESTING ONE-TIME PROGRAMMABLE (OTP) MEMORY WITH DATA INPUT CAPTURE THROUGH SENSE AMPLIFIER CIRCUIT

(71) Applicant: QUALCOMM Incorporated, San Diego, CA (US)

(72) Inventors: Anil Chowdary Kota, San Diego, CA (US); Keejong Kim, Phoenix, AZ (US); Hochul Lee, Los Angeles, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/792,636

(22) Filed: Feb. 17, 2020

(65) Prior Publication Data

US 2021/0257007 A1    Aug. 19, 2021

(51) Int. Cl.
*G11C 7/10* (2006.01)
*G11C 7/06* (2006.01)
*G11C 17/16* (2006.01)
*G11C 29/14* (2006.01)

(52) U.S. Cl.
CPC .............. *G11C 7/065* (2013.01); *G11C 7/106* (2013.01); *G11C 7/1057* (2013.01); *G11C 7/1087* (2013.01); *G11C 17/16* (2013.01); *G11C 29/14* (2013.01); *G11C 2207/063* (2013.01)

(58) Field of Classification Search
CPC ....... G11C 7/065; G11C 7/1057; G11C 7/106; G11C 7/1087; G11C 17/16; G11C 29/14; G11C 2207/063
See application file for complete search history.

(56) References Cited

U.S. PATENT DOCUMENTS

| 6,525,966 | B1 * | 2/2003 | Hollmer | G11C 16/06 365/185.2 |
|---|---|---|---|---|
| 6,906,557 | B1 * | 6/2005 | Parker | G11C 17/18 323/316 |
| 2016/0372163 | A1 * | 12/2016 | Plavec | G11C 7/067 |
| 2017/0110206 | A1 * | 4/2017 | Ryu | G11C 29/52 |
| 2018/0108425 | A1 * | 4/2018 | Lee | G11C 17/16 |
| 2019/0293716 | A1 * | 9/2019 | Yokoyama | G11C 29/46 |

* cited by examiner

*Primary Examiner* — Tuan T Nguyen
(74) *Attorney, Agent, or Firm* — Patterson+ Sheridan, L.L.P.

(57) ABSTRACT

Certain aspects of the present disclosure provide methods and apparatus for testing a one-time programmable (OTP) memory device, including the functionality of a sense amplifier circuit. The OTP memory device includes a memory array, an input latch circuit, and a sense amplifier circuit comprising a current source and a multiplexer. The multiplexer has a first input coupled to an output of the memory array, a second input coupled to the input latch circuit, and an output coupled to an input of the current source circuit.

11 Claims, 6 Drawing Sheets

TESTING ONE-TIME PROGRAMMABLE (OTP) MEMORY WITH DATA INPUT CAPTURE THROUGH SENSE AMPLIFIER CIRCUIT

TECHNICAL FIELD

The teachings of the present disclosure relate generally to electronic circuits, and more particularly, to techniques for testing a one-time programmable (OTP) memory device.

BACKGROUND

Integrated circuit (IC) testing is vital to the functionality of most electronic devices. Without testing, both prior to final installation and once installed onto a circuit board, many devices may arrive non-functional or cease functioning earlier than their expected life spans. Design for testing or design for testability (DFT) is a popular technique for IC testing and consists of IC design techniques that add testability features to a hardware product design. The added features make it easier to develop and apply manufacturing tests to the designed hardware. The purpose of manufacturing tests is to validate that the product hardware contains no manufacturing defects that could adversely affect the product's correct functioning. Tests are applied at several steps in the hardware manufacturing flow and, for certain products, may also be used for hardware maintenance in the customer's environment. The tests are generally driven by test programs that execute using automatic test equipment (ATE) or, in the case of system maintenance, inside the assembled system itself. In addition to finding and indicating the presence of defects (i.e., the test fails), tests may be able to log diagnostic information about the nature of the encountered test fails. The diagnostic information can be used to locate the source of the failure. In other words, the response of vectors (e.g., patterns) from a good circuit is compared with the response of vectors (using the same patterns) from a DUT (device under test). If the response is the same or matches, the DUT is good. Otherwise, the DUT is determined to be defective.

The most common method for delivering test data from chip inputs to internal circuits under test (CUTs, for short), and observing their outputs, is called scan-design. In scan-design (also referred to as "scan mode"), registers (flip-flops or latches) in the design are connected in one or more scan chains, which are used to gain access to internal nodes of the chip. Test patterns are shifted in via the scan chain(s), functional clock signals are pulsed to test the circuit during the "capture cycle(s)," and the results are then shifted out to chip output pins and compared against the expected "good machine" results.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are generally directed to circuitry for testing one-time programmable (OTP) memory devices.

Certain aspects provide an OTP memory device including a memory array, an input latch circuit, and a sense amplifier circuit comprising a current source circuit and a multiplexer. The multiplexer has a first input coupled to an output of the memory array, a second input coupled to the input latch circuit, and an output coupled to an input of the current source circuit.

Certain aspects provide a method for testing an OTP memory device. The method generally includes inputting a test bit sequence into a sense amplifier circuit of the OTP memory device while in a test mode for testing the OTP memory device; processing the test bit sequence with the OTP memory device including the sense amplifier circuit; reading out the processed test bit sequence at an output of the OTP memory device; and determining whether the sense amplifier circuit is defective based on the read out test bit sequence.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1A:
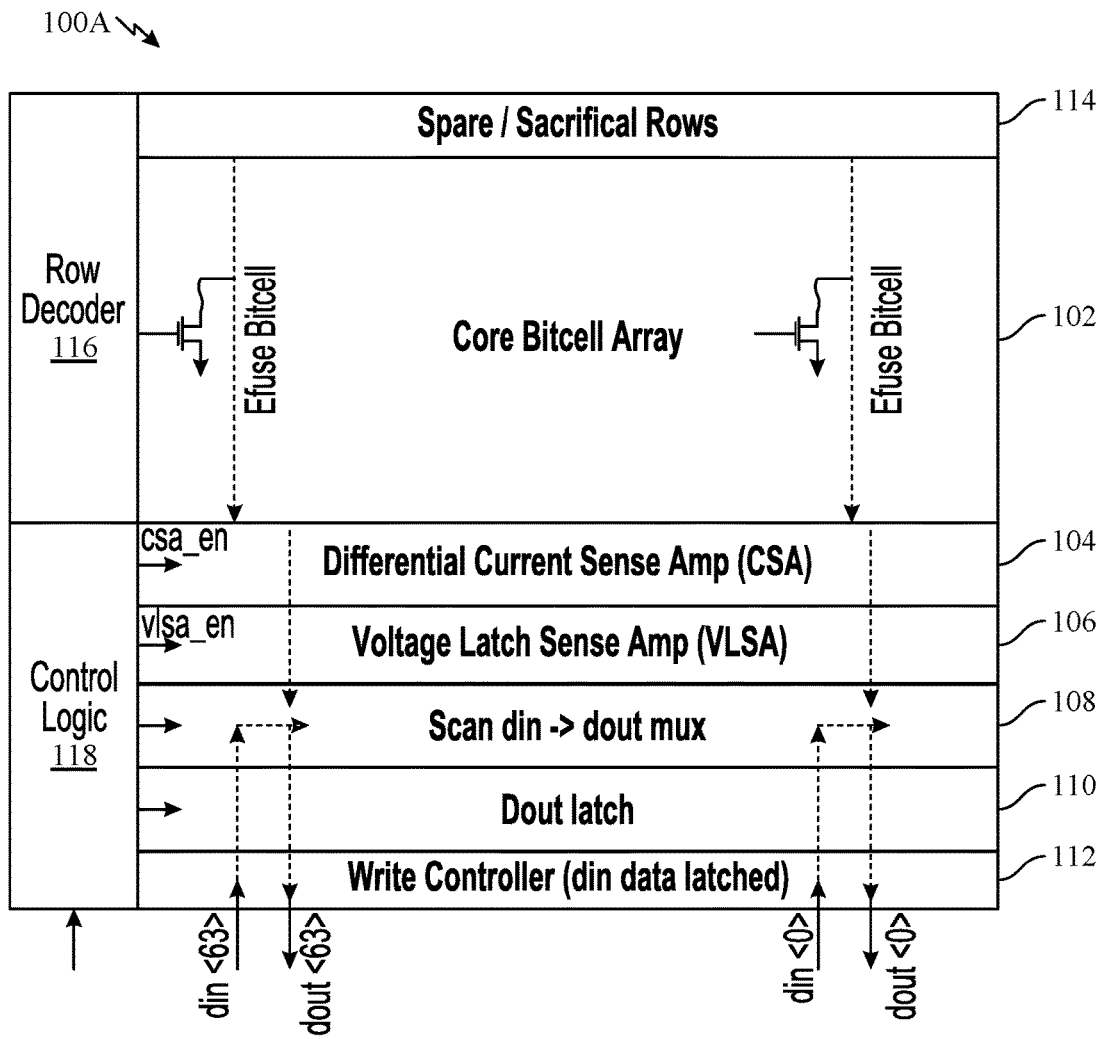
FIG. 1A conceptually illustrates an example one-time programmable (OTP) memory device with example test paths.

Certain aspects of the present disclosure provide methods and apparatus for testing a one-time programmable (OTP) memory device, including the functionality of a sense amplifier circuit, which may include a current sense amplifier (CSA) and a voltage latch sensing amplifier (VLSA). In this manner, test coverage of the sense amplifier circuit is provided during scan mode.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

A number of different types of memories and memory technologies are available or contemplated in the future, some of which are suitable for use with the various aspects of the present disclosure. Each of the memory technologies includes, for example, elements suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

In most electronic systems, some information may most likely be permanently stored such that, the information can be retained even when the power supply is off. For example, programmable systems may require a set of instructions to boot, and those particular instructions are often called "firmware." This particular set of instructions cannot be lost when the power supply is switched off. The memory used for the purpose of storing permanent data is called non-volatile memory (NVM). Solid state NVM is used in a variety of applications apart from firmware. In electronic systems, there is usually some data which is set by the manufacturer, distributors, and/or the user, and this data should be stored in the system permanently, even when the power is switched off. Thus NVM came into existence, and today NVM forms an integral part of almost any electronic system available on the market, such as set top boxes, printers, laptops, mobile phones, and other hand held devices. Also, with time, NVM has become advanced, and its capacity to hold data has increased multifold. In order to fulfill such a variety of different applications, NVMs are available in a variety of capacities, ranging from a few kilobytes to terabytes. With evolution in integration technology, now NVMs are even being embedded into processor chips. There are various types of NVMs available on the market, namely read-only memory (ROM), programmable ROM (PROM), erasable PROM (EPROM), electrically erasable PROM (EEPROM), and flash memory.

OTP (one-time programmable) memory is a special type of NVM that permits data to be written to memory only once. Once the OTP memory has been programmed, the memory retains its value upon loss of power (i.e., is non-volatile). OTP memory is used in applications where reliable and repeatable reading of unchanging data is indicated. Examples include boot code, encryption keys, and configuration parameters for analog, sensor or display circuitry. PROM is a form of OTP digital memory where the setting of each bit is locked by a fuse or antifuse. The data in a PROM is permanent and cannot be changed. PROMs are used in digital electronic devices to store permanent data, usually low-level programs such as firmware or microcode. The key difference from a standard ROM is that the data is written into a ROM during manufacture, while the data is programmed into a PROM after manufacture.

A typical PROM comes with all bits reading as "1." Burning a fuse during programming causes the bit to read as "0." The memory can be programmed just once after manufacturing by "blowing" the fuses, which is generally an irreversible process. The bit cell is programmed by applying a high-voltage pulse not encountered during a normal operation across the gate and substrate of the thin oxide transistor (around 6 V for a 2 nm thick oxide, or 30 MV/cm) to break down the oxide between the gate and substrate. The positive voltage on the transistor's gate forms an inversion channel in the substrate below the gate, causing a tunneling current to flow through the oxide. The current produces additional traps in the oxide, increasing the current through the oxide, ultimately melting the oxide, and forming a conductive channel from gate to substrate. The current involved to form the conductive channel is around 100 $\mu$A/100 nm$^2$, and the breakdown occurs in approximately 100 us or less. PROMs that are configured to be programmed via fuses, as described above, are often referred to as fuse PROMS (FPROMs).

Nowadays as the demands and design specifications of electronic systems are increasing, memory plays a vital role in these electronics devices. The electronics are becoming smaller, faster, and more intelligent, thus increasing the expectation from memory, as well. The speed of memory mainly depends on the sense amplifier block. The sense amplifier circuit is responsible for accessing the memory and converting the voltage fluctuations in the bit line into output data. In modern computer memory, a sense amplifier is one of the elements which make up the circuitry on a semiconductor memory chip. A sense amplifier is part of the read circuitry that is used when data is read from the memory. The role of the sense amplifier is to sense the low power signals from a bitline that represents a data bit (1 or 0) stored in a memory cell, and amplify the small voltage swing to recognizable logic levels so the data can be interpreted properly by logic outside the memory. Modern sense amplifier circuits consist of two to six (usually four) transistors. There may be one sense amplifier for each column of memory cells, so there are usually hundreds or thousands of identical sense amplifiers on a modern memory chip.

In certain aspects, a sense amplifier circuit of a memory device may include a current sense Amplifier (CSA) and a voltage sense amplifier (VSA) or voltage latch sense amplifier (VLSA). Current sense amplifiers (also called current shunt amplifiers) are special-purpose amplifiers that output a voltage proportional to the current flowing in an electrical path. CSAs utilize a "current-sense resistor" to convert the load current in the electrical path to a voltage, which is then amplified by the current sense amplifier. Voltage sense amplifiers evaluate a small voltage difference which is applied at their inputs and convert this difference into a logic level output signal. In certain aspects, a voltage sense amplifier may be implemented in the read circuitry of a memory device as a second stage after a first CSA stage.

Obtaining the correct output when accessing the memory is an essential and important process, and thus, it may be desirable to test the functionality of the sense amplifier circuit (e.g., CSA and VLSA), for example, after manufacturing the memory chip.

FIG. 1A conceptually illustrates an example OTP memory device 100A (e.g., FPROM device) in which aspects of the present disclosure may be practiced. As shown, memory device 100A includes a core bitcell array 102 (also referred to as a "memory array") containing OTP bitcells that store data bits. The functional read path for reading data from the bitcells includes a CSA 104, a VLSA 106, a scan multiplexer (MUX) 108, and an output latch circuit, shown as $d_{out}$ latch 110. Scan chain testing may be used to test the OTP memory device 100A by inputting a test bit pattern (e.g., Automatic Test Pattern Generation (ATPG) test pattern) into the scan MUX 108 and reading out the test bit pattern via the remainder of the functional read path (e.g., the $d_{out}$ latch 110). However, because the test bit pattern is input into the scan MUX 108, the CSA/VLSA circuits are not included in the scan chain testing. Thus, spare/sacrificial rows 114 in the memory device 100A may be used for separately testing the CSA/VLSA circuits. The functional path of the CSA/VLSA circuits is generally tested by writing a test bit pattern in one or more spare rows 114, by processing the written test bit pattern in a test mode using the CSA/VLSA, and by reading out the processed test bit pattern using the $d_{out}$ latch 110. Testing the CSA/VLSA in the test mode using the spare rows 114 is not ideal as the spare rows 114 use valuable chip area which otherwise can be used for adding more rows to the core bitcell array 102 or for implementing other functional circuits. Further, the spare rows 114 offer limited test coverage for CSA/VLSA as the spare rows are generally written and read with a fixed alternating pattern of 1s and 0s. In addition, more spare rows could be utilized for more robust testing of the CSA/VLSA, but this would add more area overhead.

A write controller 112 is provided for writing data bits into the core bitcell array 102 (during OTP programming) and the spare rows 114. Each row of the core bitcell array 102 and the spare rows 114 is referred to as a word line (WL), and each column is referred to as a bit line (BL). As shown, each bitcell of the core bitcell array 102 is implemented using electrically programmable fuses (Efuse). In the example memory device 100A, each word of the core bitcell array 102 and spare rows 114 has 64 bits. Input lines din 0-63 may be used to write data into the core bitcell array 102 (during OTP programming) and the spare rows 114 (for CSA/VLSA testing). $d_{out}$ lines 0-63 may be used to read out words from the core bitcell array 102 and spare rows 114. The row decoder 116 provides WL enable signals to select particular rows which are identified by memory addresses. The control logic 118, among other things, provides enable signals for CSA (e.g., csa_en) and VLSA (e.g., vlsa_en).

In certain aspects, test coverage for an OTP memory device such as memory device 100A generally includes scan/ATPG testing provided to test the write/read control logic circuits of the OTP memory device. However, the scan mode generally bypasses the CSA/VLSA circuits in the functional read path.

In an aspect, when a scan mode is enabled, a data pattern (also referred to as a "test bit sequence") may be directly fed through the write/read logic circuit (e.g., using the din lines input to the scan MUX 108), thereby bypassing the CSA/VLSA, and the output may be observed on the dout lines. During a functional mode to test the CSA/VLSA circuits, the scan MUX 108 is controlled (e.g., by the control logic 118) to select a different input, and data from the core bitcell array 102 or test pattern (as written using din lines) from the spare rows (when testing the CSA/VLSA) may be read out via the dout lines. The scan multiplexer 108 is generally used after the CSA/VLSA stage to select between the VLSA output (in the functional mode or to test the CSA/VLSA circuits) and the din lines (in scan mode). A scan mode enable signal (e.g., scan_mode signal) is used to control the scan MUX 108.

Figure 1B:
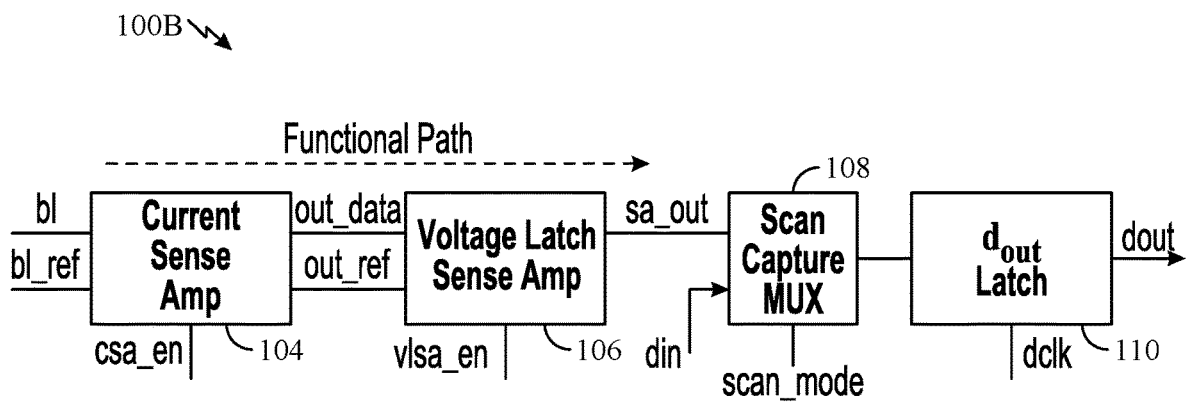
FIG. 1B illustrates an example block diagram of a typical functional read path of the OTP memory device of FIG. 1A.

FIG. 1B illustrates an example block diagram of a typical functional read path 100B of an OTP memory device (e.g., memory device 100A of FIG. 1A).

As shown, the read path 100B includes the CSA 104, the VLSA 106, the scan multiplexer 108, and the $d_{out}$ latch 110. As described earlier, the scan multiplexer 108 bypasses the CSA 104 and the VLSA 106 when the scan mode is enabled (e.g., using the scan_mode signal) and forwards test bit patterns received on the din lines to the read logic. However, when the scan mode is disabled, the scan multiplexer selects the output of the VLSA 106 (labeled as an "sa_out" signal) to send to the $d_{out}$ latch 110.

The CSA 104 receives an input signal from a bitcell bitline (shown as bl) from the bitcell array 102 and another input signal as a bitline reference (shown as bl_ref) from a reference circuit (not shown in FIGS. 1A and 1B). When enabled by the csa_en signal, the CSA 104 converts the current signals on the bl and bl_ref inputs from the bitcell array 102 and reference circuit, respectively, into corresponding voltage signals: a data output signal and a reference output signal (shown as out_data and out_ref, respectively). When enabled by the vlsa_en signal, the VLSA 106 compares these voltage signals and outputs a signal (shown as sa_out) representing a logical 0 or 1. The signal sa_out is forwarded by the scan multiplexer 108 to the $d_{out}$ latch 110 when in a functional mode or test mode for the CSA/VLSA (e.g., not in scan mode as decided by the scan_mode signal). The Dout latch 110 outputs the stored bit to a corresponding dout line.

Figure 1C:
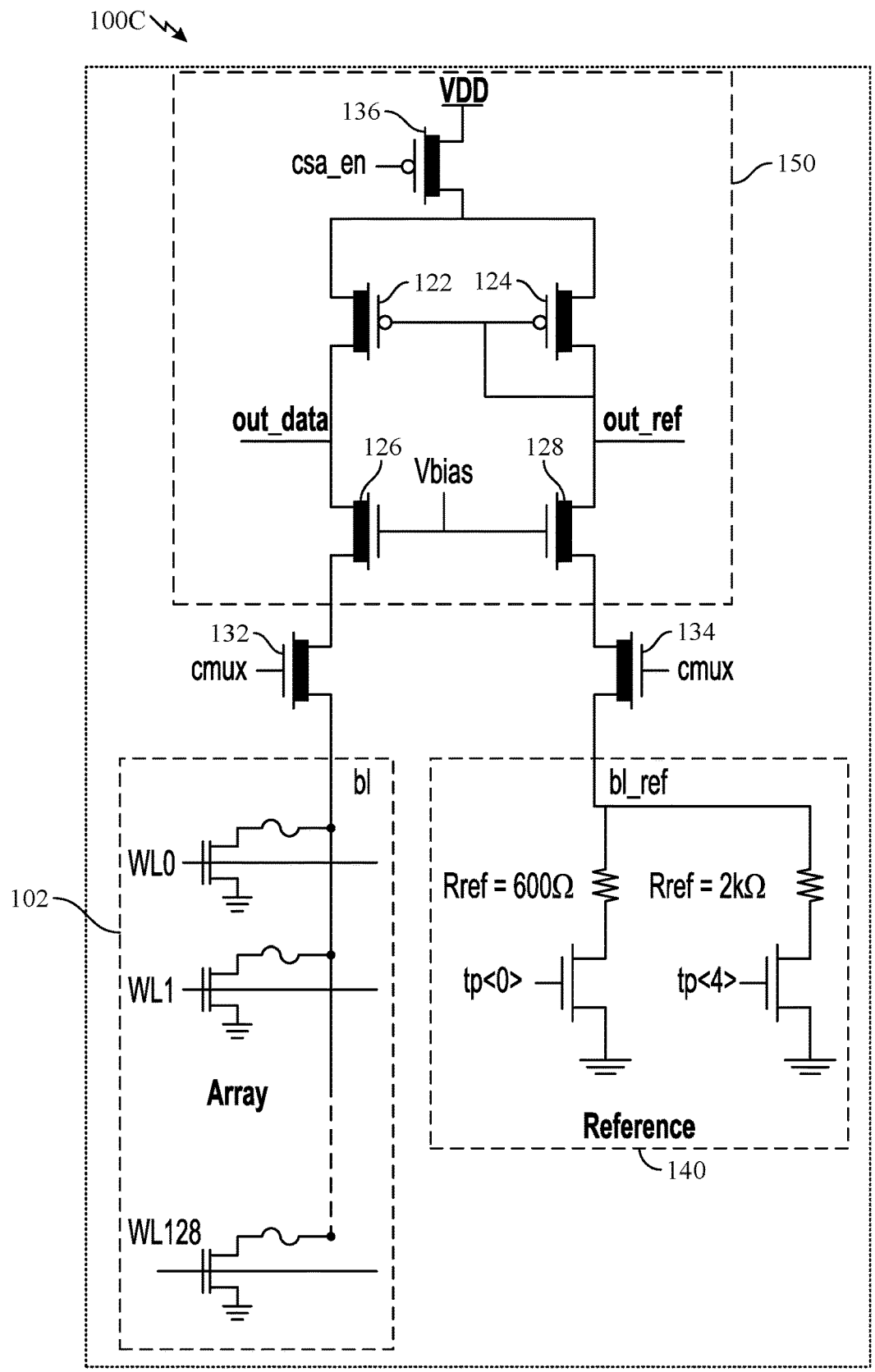
FIG. 1C illustrates an example circuit implementation of a portion of the OTP memory device of FIG. 1A.

FIG. 1C illustrates an example circuit implementation 100C of a memory device (e.g., a portion of the memory device 100A). As shown, the CSA 104 includes a current source circuit a current source circuit 150, the core bitcell array 102, a multiplexer, and a reference circuit 140. The current source circuit 150 is constructed of five transistors including three p-channel transistors 122, 124, and 136 and two n-channel transistors 126 and 128. The sources of p-channel transistors 122 and 124 are coupled to a power supply node (labeled "VDD") via p-channel transistor 136. As shown, the gate of the p-channel transistor 136 is coupled to the csa_en signal, which is responsible for enabling the current source circuit 150 when reading out data from the bitcell array 102 or spare rows 114. The sources of n-channel transistors 126 and 128 act as inputs to the current source circuit 150. As shown, the source of n-channel transistor 126 is coupled to an output bit line bl of a particular bit line from the bitcell array 102 via n-channel transistor 132 in the multiplexer. The source of n-channel transistor 128 is coupled to an output bit line bl_ref of the reference circuit 140 via n-channel transistor 134 in the multiplexer. As shown, the gates of the transistors 132 and 134 are coupled to a cmux enable signal node which enables these transistors in the functional mode when reading out data from the bit line.

As shown, the reference circuit 140 may include one or more reference resistors. For example, as shown in FIG. 1C, the reference circuit 140 includes two reference resistors with resistance values (Rref) of 600Ω and 2 kΩ. Any one of the reference resistors may be selected at any time by a corresponding enable signal (shown as tp<n> signal). For example, the 600Ω resistor may be selected using the tp<0> signal, and the 2 kΩ resistor may be selected using the tp<4> signal. The reference circuit 140 may include any positive integer number n of reference branches coupled in parallel, each branch with one or more resistive elements.

For current sensing, the CSA converts the currents which are drawn from the reference side and cell side into voltage signals so that the voltage signals can be compared by a comparator circuit (e.g., VLSA 106)), which produces the output in the form of recognizable logic levels such as '0' and '1.' As shown in FIG. 1C, the CSA outputs an out_data signal and an out_ref signal corresponding to the currents on the bl and bl_ref nodes, respectively. These outputs are fed to the VLSA which compares the voltages on these outputs and produces a logical 0 or 1 as output (shown as sa_out).

In an aspect, when reading a blown fuse on the bit line, the resistance of the blown fuse is generally higher (e.g., >10 kΩ) as compared to the resistance of a reference resistor (e.g., 600Ω or 2 kΩ). Thus, the CSA senses bl (v)>bl_ref (v) on its inputs and outputs out_data (v)>out_ref (v). The VLSA 106 compares the voltages on the out_data and out_ref inputs, and since out_data (v)>out_ref (v), outputs sa_out=1. The logical 1 output by the VLSA 106 is then latched by the $d_{out}$ latch 110 and is output to a corresponding dout line.

In an aspect, when reading an unblown fuse on the bit line, the resistance of the unblown fuse is generally lower (e.g., about 100Ω) as compared to the resistance of a reference resistor (e.g., 600Ω or 2 kΩ). Thus, the CSA senses bl (v)<bl_ref (v) on its inputs and outputs out_data (v)<out_ref (v). The VLSA 106 compares the voltages on the out_data and out_ref inputs, and since out_data (v)< out_ref (v), outputs sa_out=0. The logical 0 output by the VLSA 106 is then latched by the $d_{out}$ latch 110 and is output to the corresponding dout line.

As noted above, the CSA/VLSA circuits in current memory devices are generally tested by writing a test bit pattern in one or more spare rows (e.g., spare rows 114 as shown in FIG. 1A) and by reading out the written test bit pattern using the CSA/VLSA. This kind of testing is not ideal as the spare rows use valuable chip area and offer limited test coverage.

Certain aspects of the present disclosure provide techniques and apparatus for testing the sense amplifier circuit (e.g., CSA and/or VLSA) of a memory device (e.g., an OTP memory device) without using spare rows (e.g., spare rows 114) in the memory device. The discussed techniques include methods for writing a test bit pattern (e.g., ATPG bit pattern) directly into the CSA in a scan/test mode and reading out the test bit pattern using the memory device's functional read path. In this way, the discussed techniques mimic the functional path during din→dout scan mode for better test coverage. Since, the techniques for testing the sense amplifier circuit discussed herein do not use spare rows, chip area overhead is reduced. Additionally, these techniques allow any random din pattern to be written into the CSA. Thus, these techniques provide greater flexibility as compared to conventional methods for testing the sense amplifier circuit as discussed above.

Figure 2A:
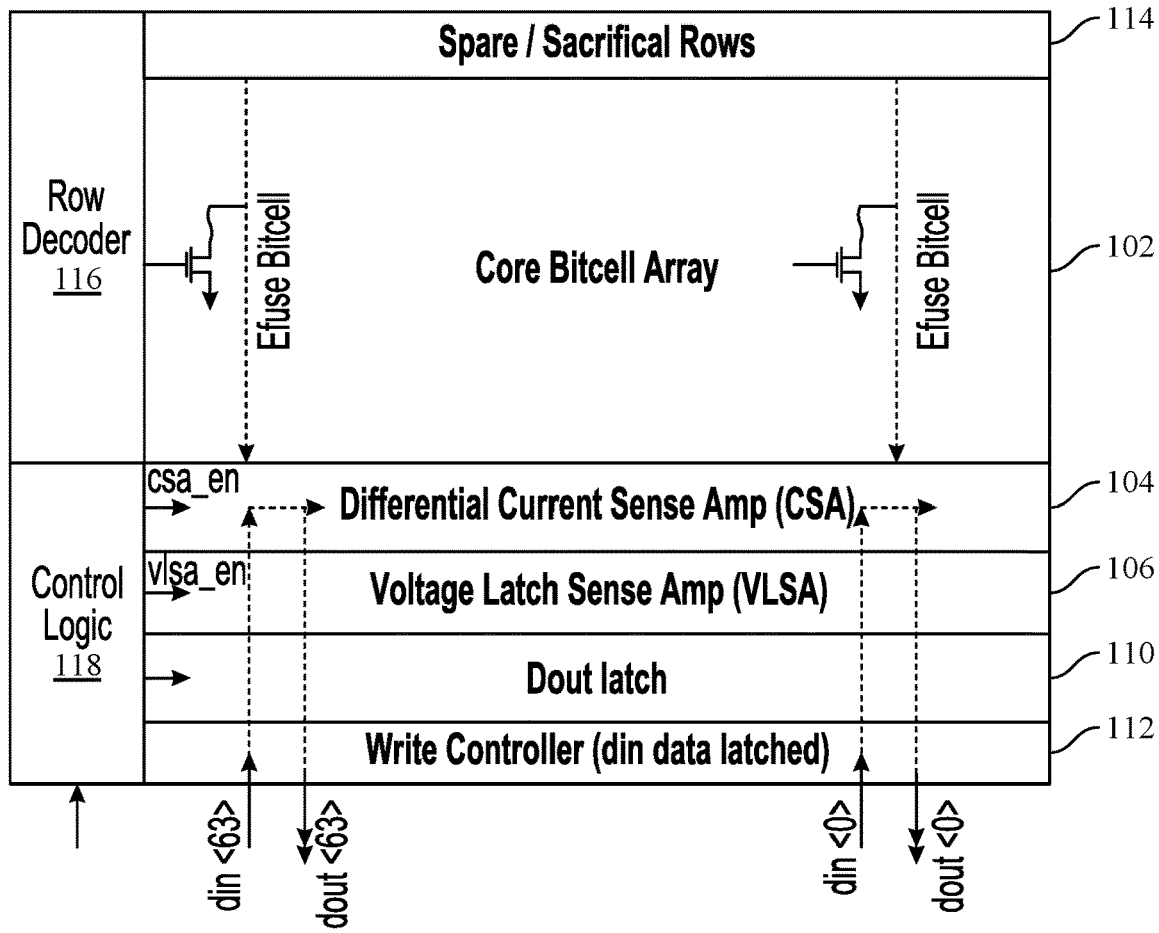
FIG. 2A conceptually illustrates an example OTP memory device with example test paths, in accordance with certain aspects of the present disclosure.

FIG. 2A conceptually illustrates an example OTP memory device 200A (e.g., FPROM device), in accordance with certain aspects of the present disclosure. Please note that like elements in FIGS. 1A and 2A are identified by the same reference numerals.

As shown in FIG. 2A, the din lines feed into the CSA 104. Thus, any random test bit pattern may be fed into the CSA directly using the din lines. A test bit pattern fed into the CSA may be read out using the functional path (i.e., nearly the same path may be used for both scan mode and functional mode), and the output may be observed at the dout lines. The observed output may be compared to an expected output for the test bit pattern in order to determine whether the CSA/VLSA are functioning as expected. It may be noted that, unlike the conventional memory device (e.g., memory device 100A as shown in FIG. 1A), the memory device 200A does not include a separate scan multiplexer (e.g., scan multiplexer 108 as shown in FIG. 1A). In an aspect, as described below, the functionality of the scan multiplexer may be incorporated in the CSA. In an aspect, the design of memory device 200A allows testing the entire read path circuitry including the CSA/VLSA in the scan mode.

Figure 2B:
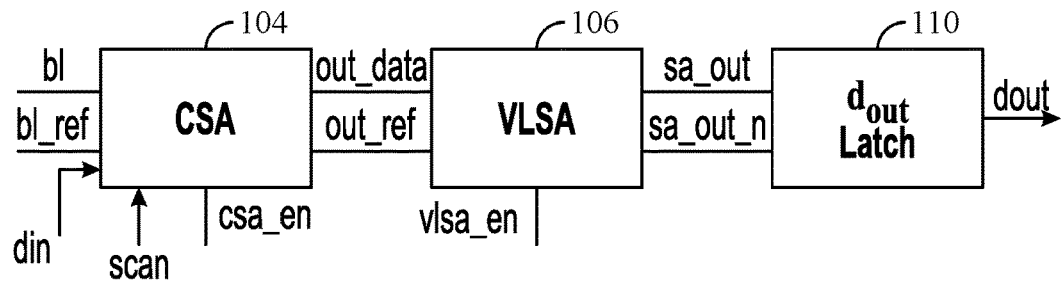
FIG. 2B illustrates an example block diagram of a typical functional read path of the OTP memory device of FIG. 2A, in accordance with certain aspects of the present disclosure.

FIG. 2B illustrates an example block diagram of a typical functional read path 200B of an OTP memory device (e.g., memory device 200A of FIG. 2A), in accordance with certain aspects of the present disclosure. Please note that like elements in FIGS. 1B and 2B are identified by the same reference numerals.

As shown in FIG. 2B the functional read path 200B includes the CSA 104, VLSA 106, and $d_{out}$ latch 110. It may be noted that, unlike the conventional read path (e.g., read path 100B as shown in FIG. 1B), the read path 200B does not include a scan multiplexer (e.g., scan multiplexer 108 as shown in FIG. 1B) between the VLSA 106 and the $d_{out}$ latch 110 for receiving the din lines. Rather, as shown in FIG. 2B, the din lines are coupled to the CSA and may input test bit patterns directly into the CSA 104. In an aspect, a test bit pattern may be read out using the functional path 200B via the CSA 104, VLSA 106, and $d_{out}$ latch 110, and the output may be observed on the dout lines. In an aspect, the read path 200B may be tested in a scan mode enabled via a scan enable signal (shown as 'scan' in FIG. 2B). As shown, the scan enable signal is fed into the CSA 104 and enables the scan mode for testing the functional read path 200B.

In an aspect, since the testing of the functional read path 200B as described with reference to FIGS. 2A and 2B does not involve using spare rows (e.g., spare rows 114), the spare rows may be reduced, thus saving chip area overhead. Further, any random test bit pattern may be used to test the functional read path, thus providing more flexibility in testing as compared, for example, to the testing mechanism described above.

Figure 3:
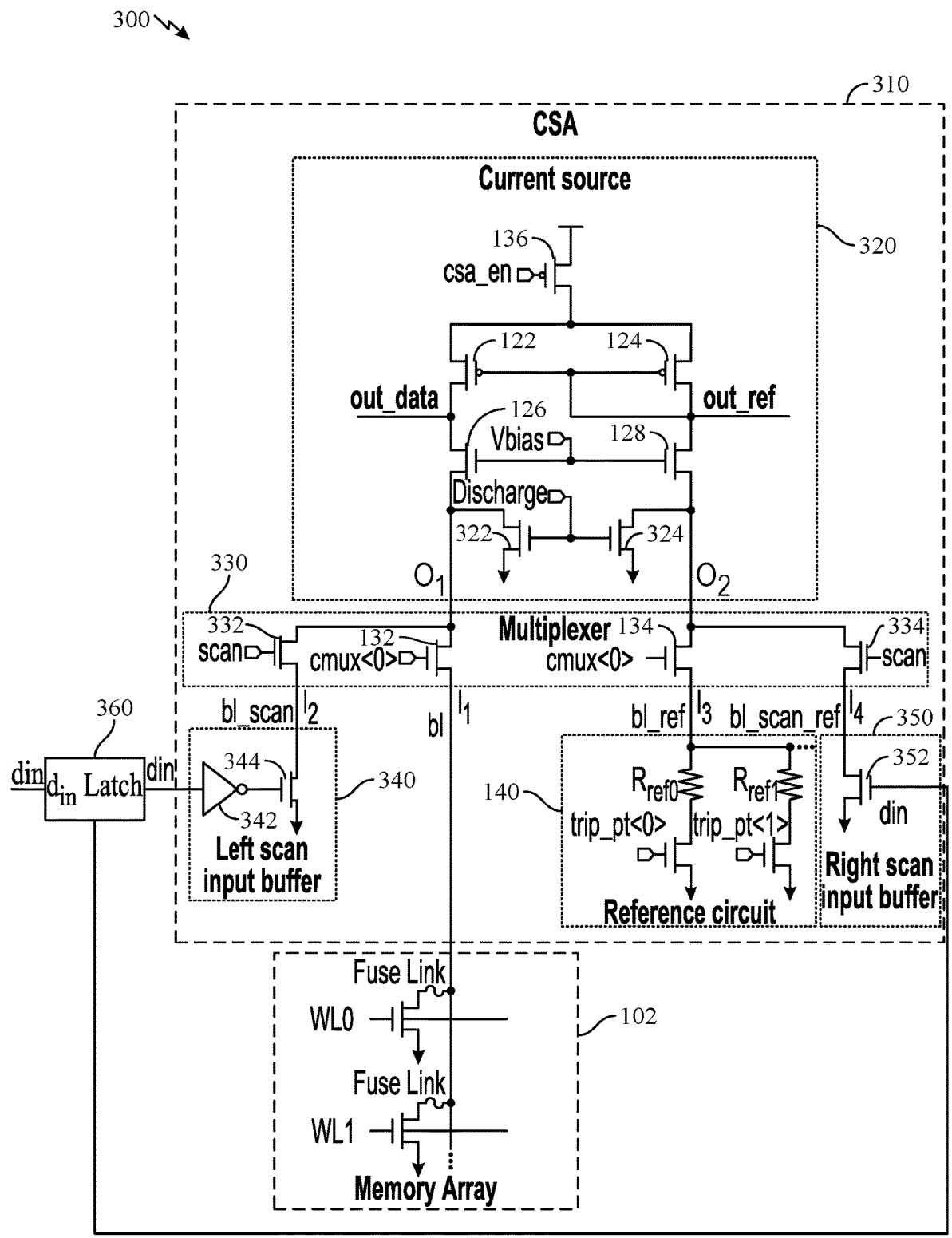
FIG. 3 illustrates an example circuit implementation of a memory device, in accordance with certain aspects of the present disclosure.

FIG. 3 illustrates an example circuit implementation 300 of a memory device (e.g., memory device 200A), in accordance with certain aspects of the present disclosure. It may be noted that like elements in FIG. 1C and FIG. 3 are identified by the same reference numerals.

As shown in FIG. 3, the CSA 310 of the memory device includes a current source circuit 320, a multiplexer 330, a reference circuit 140, a left scan buffer circuit 340, and a right scan buffer circuit 350. In an aspect, the current source circuit 320 has a circuit construction similar to that of the CSA 104 as shown in FIG. 1C. Additionally, as shown, the current source may include two additional n-channel transistors 322 and 324.

The multiplexer 330 has four inputs I1 to I4 and two outputs O1 and O2. Input I1 of the multiplexer 330 is coupled to a bit line output bl of the memory array (e.g., the bitcell array 102). Input I2 of the multiplexer 330 is coupled to a din input from the write circuit of the memory device (e.g., write controller 112 as shown in FIG. 2A) via the left scan buffer circuit 340. In an aspect, the din input may be one of multiple din inputs supported by the memory device. In an aspect, the din input may be an output of a corresponding din input latch circuit 360 as shown. In an aspect, the din input latch circuit 360 may be implemented in the write controller circuit 112. For example, the din input may be one of 64 din inputs shown in FIG. 2A. Input I3 of the multiplexer 330 is coupled to the bit line reference output bl_ref of the reference circuit 140. Input I4 of the multiplexer 330 is also coupled to the same din input from the write circuit via the right scan buffer circuit 350.

Outputs O1 and O2 of the multiplexer 330 are coupled to the inputs of the current source circuit 320. For example, as shown output O1 is coupled to the source of n-channel transistor 126, and O2 is coupled to the source of n-channel transistor 128. The construction of the multiplexer 330, in addition to the n-channel transistors 132 and 134 as shown in FIG. 1C, additionally includes n-channel transistors 332 and 334. As shown, the n-channel transistor 332 has a drain coupled to the output O1, a source coupled to the input I2, and a gate coupled to the 'scan' selection input. The n-channel transistor 132 has a drain coupled to the output O1, a source coupled to the input I1, and a gate coupled to the 'cmux' selection input. The n-channel transistor 134 has a drain coupled to the output O2, a source coupled to the input I3, and a gate coupled to the 'cmux' selection input. The n-channel transistor 334 has a drain coupled to the output O2, a source coupled to the input I4, and a gate coupled to the 'scan' selection input. In an aspect, the 'scan' and 'cmux' selection inputs are control inputs for the multiplexer, where signals at the scan and cmux selection inputs select either inputs I1 and I3, or inputs I2 and I4 at any one time. For example, only one of the scan and cmux inputs is logic high at one time. When the cmux input is high, the multiplexer 330 selects inputs I1 and I3 for output at outputs O1 and O2, respectively. Alternatively, when the scan input is logic high, the multiplexer selects inputs I2 and I4 for output at outputs O1 and O2, respectively. In an aspect, the cmux input is logic high when the memory device is configured to read from the memory array (e.g., the bitcell array 102). The scan input is used to initiate a scan mode and is logic high when the memory device is configured for testing the functional read path including the CSA and the VLSA.

As shown in FIG. 3, the left scan buffer circuit 340 includes an inverter 342 and an n-channel transistor 344. The input of the inverter 342 is coupled to the din input from the write circuit, and the output of the inverter is coupled to the gate of the n-channel transistor 344. The n-channel transistor 344 has a drain coupled to the input I2 of the multiplexer 330 and a source coupled to a reference potential node (e.g., electrical ground) of the CSA 310.

As shown in FIG. 3, the right scan buffer circuit 350 includes an n-channel transistor 352 with a drain coupled to the input I4 of the multiplexer 330, a source coupled to the reference potential node, and a gate coupled to the din input from the write circuit. In this manner, the single-ended test bit sequence may be input to the CSA 310 as a differential input pair with complementary inputs.

As shown in FIG. 3, the reference circuit 140 includes a variable resistance array having a plurality of branches coupled in parallel, each branch including at least one resistive element connected in series with an n-channel transistor. The n-channel transistor in each branch has a gate coupled to a reference circuit selector signal node (labeled "trip_pt<n>"), a source coupled to the reference potential node, and a drain coupled to a first terminal of the resistive element. A second terminal of the resistive element is coupled to input I3 of the multiplexer 330.

As shown in FIG. 3, the CSA 310 generates a data output out_data and a data reference output out_ref. In an aspect, when the cmux selection signal is logic high, the circuit 300 operates as described in FIG. 1C. In an aspect, when the scan selection signal is logic high and the circuit 300 is in the scan mode, the outputs out_data and out_ref depend on the din input. For example, when din=0, bl_scan (v)<bl_scan_ref (v), and thus, out_data (v)<out_ref (v). On the other hand, when din=1, bl_scan (v)>bl_scan_ref (v), and thus, out_data (v)>out_ref (v).

In an aspect, the circuit 300 further includes a VLSA (e.g., VLSA 106) having a differential input pair coupled to the outputs out_data and out_ref. The VLSA may be configured to generate a sample output (e.g., sa_out as shown in FIG. 1B or a differential output pair "sa_out" and "sa_out_n" as shown in FIG. 2B) based on the outputs out_data and out_ref. For example, the VLSA may be configured to compare the differential inputs and generate a logical '0' or logical '1' as a sample output sa_out. For example, sa_out=1 when out_data (v)>out_ref (v), and sa_out=0 when out_data (v)<out_ref (v).

In an aspect, the circuit 300 further includes a $d_{out}$ latch (e.g., $d_{out}$ latch 110 as shown in FIG. 1B) with an input coupled to the output sa_out of the VLSA and an output coupled to a dout line of the memory device. In an aspect, the dout line may be one of multiple dout lines.

Figure 4:
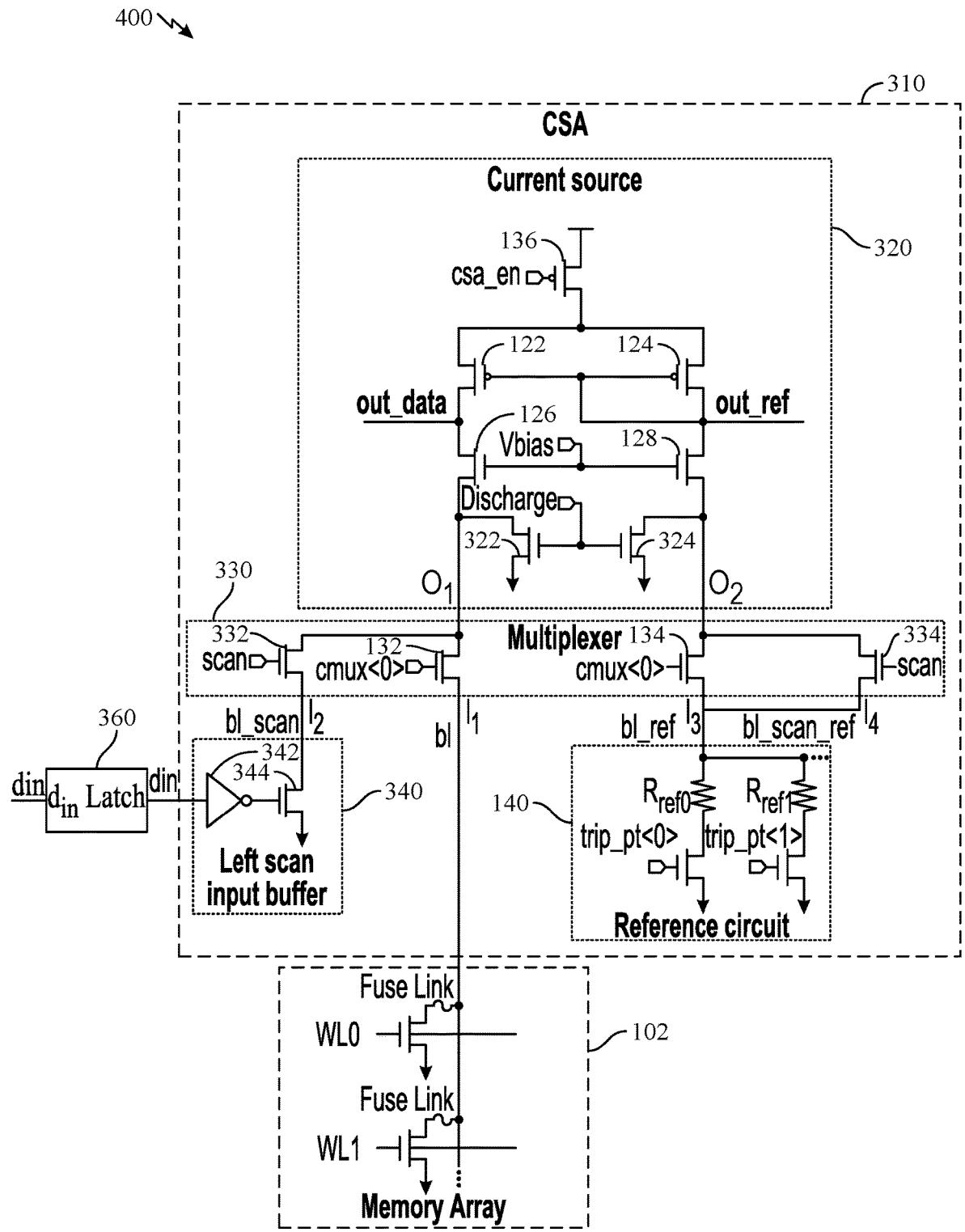
FIG. 4 illustrates an alternative circuit implementation of a memory device, in accordance with certain aspects of the present disclosure.

FIG. 4 illustrates an alternative circuit implementation of a memory device (e.g., memory device 200A), in accordance with certain aspects of the present disclosure. It may be noted that like elements in FIG. 3 and FIG. 4 are identified by the same reference numerals.

As shown in the circuit 400 of FIG. 4, the source of the n-channel transistor 334 (i.e., the input I4) is coupled to the bl_refline and the input I3 instead of being coupled to the bl_scan_ref line from the right scan buffer circuit 350. Thus, while in the scan mode, the circuit 400 uses the output bl_ref of the reference circuit for comparison with the bl_scan line of the left scan buffer circuit 340. In an aspect, the operation of circuit 400 is similar to the operation of circuit 300. For example, when din=0, bl_scan (v)<bl_ref (v), and thus, out_data (v)<out_ref (v). On the other hand, when din=1, bl_scan (v)>bl_ref (v), and thus, out_data (v)>out_ref (v).

Figure 5:
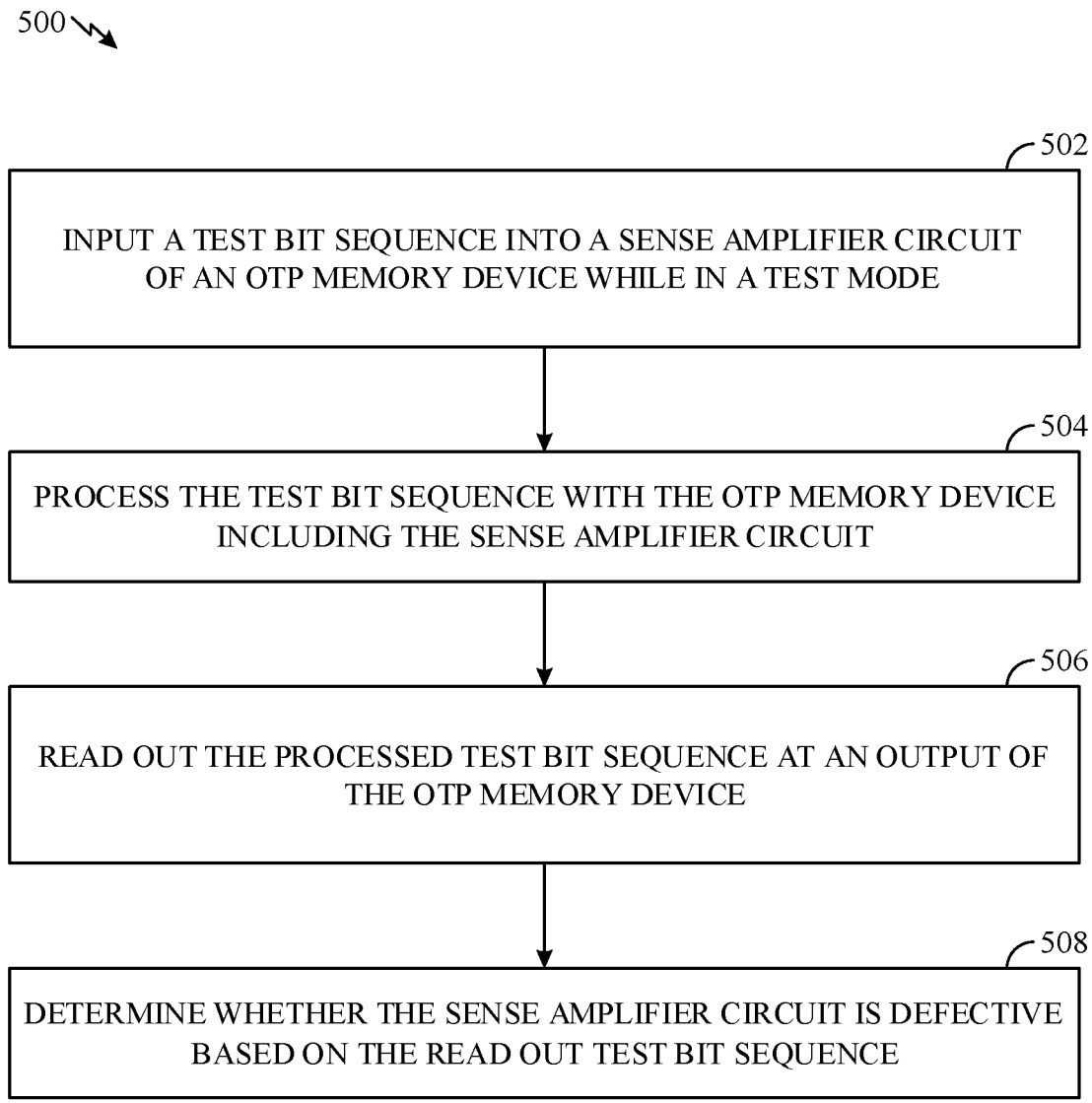
FIG. 5 illustrates example operations for testing an OTP memory device, in accordance with certain aspects of the present disclosure.

FIG. 5 illustrates example operations 500 for testing an OTP memory device, in accordance with certain aspects of the present disclosure.

Operations 500 begin, at block 502, by inputting a test bit sequence into a sense amplifier circuit of the OTP memory device while in a test mode for testing the OTP memory device.

At block 504, the test bit sequence is processed with the OTP memory device including the sense amplifier circuit (e.g., to test the functionality of the entire path in the OTP memory device, including the sense amplifier circuit).

At block 506, the processed test bit sequence is read out at an output of the OTP memory device.

At block 508, it is determined whether the sense amplifier circuit is defective based on the read out test bit sequence.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A one-time programmable (OTP) memory device comprising:
    a memory array;
    an input latch circuit; and
    a sense amplifier circuit comprising a current source circuit, a multiplexer, and a reference circuit, wherein the multiplexer comprises:
        a first input coupled to an output of the memory array;
        a second input coupled to the input latch circuit;
        a third input coupled to the reference circuit;
        a fourth input coupled to the input latch circuit;
        an output coupled to an input of the current source circuit;
        another output coupled to another input of the current source circuit;
        a first selection input; and
        a second selection input, wherein the first and second selection inputs are configured to select:
            the second input and the fourth input for output by the output and the other output, respectively, of the multiplexer; or
            the first input and the third input for output by the output and the other output, respectively, of the multiplexer.

2. The OTP memory device of claim 1, wherein:
    the sense amplifier circuit comprises a current sense amplifier (CSA);
    the CSA comprises the current source circuit, the multiplexer, the reference circuit, a first buffer circuit, and a second buffer circuit;
    the second input of the multiplexer is coupled to the input latch circuit via the first buffer circuit;
    the fourth input of the multiplexer is coupled to the input latch circuit via the second buffer circuit;

the first buffer circuit comprises:
    an inverter having an input coupled to the input latch circuit; and
    a first n-channel transistor having a gate coupled to an output of the inverter, a drain coupled to the second input of the multiplexer, and a source coupled to a reference potential node;
the second buffer circuit comprises a second n-channel transistor having a gate coupled to the input latch circuit, a drain coupled to the fourth input of the multiplexer, and a source coupled to the reference potential node; and
the CSA is configured to generate a data output signal and a reference output signal on a data output and a reference output, respectively.

3. The OTP memory device of claim 2, wherein the sense amplifier circuit further comprises a voltage latch sense amplifier (VLSA) having a differential input pair coupled to the data output and the reference output, the VLSA being configured to generate a sample output based on the data output signal and the reference output signal from the CSA.

4. The OTP memory device of claim 1, wherein the reference circuit comprises a variable resistance array having a plurality of branches coupled in parallel, each branch comprising a resistive element in series with an n-channel transistor having a gate coupled to a reference circuit selector signal node, a source coupled to a reference potential node, and a drain coupled to a first terminal of the resistive element, and wherein a second terminal of the resistive element is coupled to the third input of the multiplexer.

5. The OTP memory device of claim 1, further comprising an output latch circuit having an input coupled to an output of the sense amplifier circuit.

6. A one-time programmable (OTP) memory device comprising:
    a memory array;
    an input latch circuit; and
    a sense amplifier circuit comprising a current source circuit, a multiplexer, and a reference circuit, wherein the multiplexer comprises:
        a first input coupled to an output of the memory array;
        a second input coupled to the input latch circuit;
        a third input coupled to the reference circuit;
        a fourth input coupled to the reference circuit and to the third input of the multiplexer;
        an output coupled to an input of the current source circuit;
        another output coupled to another input of the current source circuit;
        a first selection input; and
        a second selection input, wherein the first and second selection inputs are configured to select:
            the second input and the fourth input for output by the output and the other output, respectively, of the multiplexer; or
            the first input and the third input for output by the output and the other output, respectively, of the multiplexer.

7. The OTP memory device of claim 6, wherein:
the sense amplifier circuit comprises a current sense amplifier (CSA);
the CSA comprises the current source circuit, the multiplexer, the reference circuit, and a buffer circuit;
the second input of the multiplexer is coupled to the input latch circuit via the buffer circuit;
the buffer circuit comprises an n-channel transistor having a gate coupled to the input latch circuit, a drain coupled to the second input of the multiplexer, and a source coupled to a reference potential node; and
the CSA is configured to generate a data output signal and a reference output signal on a data output and a reference output, respectively.

8. The OTP memory device of claim 7, wherein the buffer circuit further comprises an inverter having an input coupled to the input latch circuit and having an output coupled to the gate of the n-channel transistor.

9. The OTP memory device of claim 7, wherein the sense amplifier circuit further comprises a voltage latch sense amplifier (VLSA) having a differential input pair coupled to the data output and the reference output, the VLSA being configured to generate a sample output based on the data output signal and the reference output signal from the CSA.

10. The OTP memory device of claim 6, wherein the reference circuit comprises a variable resistance array having a plurality of branches coupled in parallel, each branch comprising a resistive element in series with an n-channel transistor having a gate coupled to a reference circuit selector signal node, a source coupled to a reference potential node, and a drain coupled to a first terminal of the resistive element, and wherein a second terminal of the resistive element is coupled to the third and fourth inputs of the multiplexer.

11. The OTP memory device of claim 6, further comprising an output latch circuit having an input coupled to an output of the sense amplifier circuit.

* * * * *